(12) United States Patent
Pohl et al.

(10) Patent No.: US 7,943,423 B2
(45) Date of Patent: May 17, 2011

(54) RECONFIGURED WAFER ALIGNMENT

(75) Inventors: Jens Pohl, Bernhardswald (DE); Edward Fuergut, Dasing (DE); Markus Brunnbauer, Lappersdorf (DE); Thorsten Meyer, Regensburg (DE); Peter Strobel, Regensburg (DE); Daniel Porwol, Straubing (DE); Ulrich Wachter, Riedenburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/401,111

(22) Filed: Mar. 10, 2009

(65) Prior Publication Data

US 2010/0233831 A1 Sep. 16, 2010

(51) Int. Cl.
*H01L 21/00* (2006.01)

(52) U.S. Cl. .. 438/112; 438/124; 438/127; 257/E23.116

(58) Field of Classification Search .................. 438/112, 438/110, 113, 124, 126, 127
See application file for complete search history.

(56) References Cited

U.S. PATENT DOCUMENTS

| | | | | |
|---|---|---|---|---|
| 6,326,240 | B1 * | 12/2001 | Liaw | 438/113 |
| 6,602,734 | B1 | 8/2003 | Wada et al. | |
| 2006/0065964 | A1 * | 3/2006 | Ohsumi | 257/690 |
| 2006/0094161 | A1 * | 5/2006 | Tao | 438/113 |

* cited by examiner

*Primary Examiner* — Charles D Garber
*Assistant Examiner* — Reema Patel
(74) *Attorney, Agent, or Firm* — Dicke, Billig & Czaja, PLLC

(57) ABSTRACT

A method of manufacturing semiconductor device comprises placing multiple chips onto a carrier. An encapsulation material is applied to the multiple chips and the carrier for forming an encapsulation workpiece. The encapsulation workpiece having a first main face facing the carrier and a second main face opposite to the first main face. Further, marking elements are applied to the encapsulation workpiece relative to the multiple chips, the marking elements being detectable on the first main face and on the second main face.

24 Claims, 9 Drawing Sheets

RECONFIGURED WAFER ALIGNMENT

BACKGROUND OF THE INVENTION

The invention relates to semiconductor manufacturing technology, and more particularly to the improvement of alignment processes in semiconductor device packaging technology.

Semiconductor chips are packaged to form semiconductor devices. Semiconductor devices may be fabricated by separating single chips from a wafer, rearranging them on a carrier, embedding them in plastics and providing an electrical interconnect and terminals. Cost effective packages and methods of packaging are highly desired.

For these and other reasons, there is a need for the present invention.

BRIEF DESCRIPTION OF THE SEVERAL VIEWS OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

DETAILED DESCRIPTION OF THE INVENTION

In the following, embodiments of the invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of embodiments of the invention. It may be evident, however, to one skilled in the art that one or more aspects of the embodiments of the invention may be practiced with a lesser degree of these specific details. Moreover, features which are only described with respect to a specific embodiment may also be implemented in other embodiments if possible under technical considerations. The following description is therefore not to be taken in a limiting sense, and the scope of the invention is defined by the appended claims.

In the following detailed description, reference is made to the accompanying drawings, which form a part thereof, and in which is shown by way of illustration specific embodiments in which the invention may be practiced. In this regard, directional terminology, such as "upper", "lower", "left-hand", "right-hand", "front side", "backside", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled; intervening elements may be provided between the "coupled" or "electrically coupled" elements.

The semiconductor wafers and chips described herein may be of different types, may be manufactured by different technologies and may include for example integrated electrical circuits, electro-optical circuits, electro-mechanical circuits such as e.g. MEMS (Micro-Electro-Mechanical System) and/or passives. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor wafers and chips may include control circuits, microprocessors or micro-electromechanical components. In particular, semiconductor chips having a vertical structure may be involved, that is to say that the semiconductor chips may be fabricated in such a way that electric currents can flow in a direction perpendicular to the main surfaces of the semiconductor chips. A semiconductor wafer or chip having a vertical structure may have contact elements in particular on its two main surfaces, that is to say on its front side and backside. In particular, power semiconductor chips and corresponding wafers may have a vertical structure. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of other semiconductor chips, for example the integrated circuits of power semiconductor chips. The semiconductor wafers and chips need not be manufactured from specific semiconductor material, for example Si, SiC, SiGe, GaAs, and, furthermore, may contain inorganic and/or organic materials that are not semiconductors, such as for example insulators, plastics or metals.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), etc.

Furthermore the semiconductor wafers and chips described below may comprise contact pads or, more generally, contact elements on one or more of their outer surfaces, wherein the contact elements (e.g. contact pads) may serve for electrically contacting the semiconductor chips or other circuits integrated in the semiconductor wafer. The contact elements may have the form of lands, i.e. flat contact layers on an outer surface of the semiconductor wafer or chip. The metal layer(s) of which the contact elements are made may be manufactured with any desired material composition. The metal layer(s) may, for example, be in the form of a layer covering an area. Any desired metal or metal alloy, for example aluminum, titanium, gold, silver, copper, palladium, platinum, nickel, chromium or nickel vanadium, may be used as the material. The metal layer(s) need not be homogenous or manufactured from just one material, that is to say various compositions and concentrations of the materials contained in the metal layer(s) are possible. The contact elements may be situated on the active main surfaces of the semiconductor chips or on other surfaces of the semiconductor chips.

The semiconductor chips are encapsulated in an encapsulation material. The encapsulation material may be made of an electrically insulating encapsulation or molding material such as a resin, e.g. an epoxy-based material, a photoresist etc. The encapsulation material may be of any appropriate thermoplastic or thermosetting material. Various techniques may be employed to cover the semiconductor chips with the encapsulation material, for example compression molding or injection molding. After curing, the workpiece or molded body made of the encapsulation material provides a rigid structure accommodating a plurality (e.g. typically more than 50) semiconductor chips. The molded body may have a shape of a circular disc or rectangular or square plate which has a lateral dimension of more than 200 mm or even 300 mm. Such molded bodies accommodating a plurality of spaced-apart redistributed semiconductor chips are often termed "molded reconfigured wafer" in the art.

In other words, the molded body can be regarded as an artificial wafer, and may be processed by wafer level technology such as e.g. thin-film and thick-film technologies. A structure containing one or more electrically conductive layers may be applied to a main face of the molded body. The electrically conductive layers may be used to make electrical contact with the semiconductor chips from outside of the molded body or from the outside of the devices which are subsequently obtained by dicing the molded body (molded reconfigured wafer) into a plurality of packaged single modules. The electrically conductive layers may be manufactured with any desired geometric shape and any desired material composition. The electrically conductive layers may, for example, be composed of linear conductor tracks, but may also be in the form of layers covering an area. Any desired electrically conductive materials, such as metals, for example aluminum, gold or copper, metal alloys or organic conductors, may be used as the material. The electrically conductive layers need not be homogenous or manufactured from just one material, that is to say various compositions and concentrations of the materials contained in the electrically conductive layers are possible. The structure applied to a main face of the molded body may further comprise other layers such as e.g. insulating layers, photoresists, mask layers and external terminals such as e.g. solder bumps or solder balls.

Photolithography techniques may be used for structuring one or more layers of the structure applied to a main face of the molded body. One or more optical masks may be utilized to expose e.g. a photoresist deposited on the molded body. Each one mask may be used to expose an area of the molded body which comprises a plurality of semiconductor chips, and in particular, the entire area of the molded body with all the semiconductor chips embedded therein may be exposed by each one mask.

In particular, aforementioned structures may be applied on both main faces of the molded body. In this case, one or more first optical masks may be used to process one or more first layers on the first main face of the molded body to generate the first structure thereon, and one or more second optical masks may be used to process one or more second layers on the second main face of the molded body to generate the second structure thereon. Structures applied on both main faces of the molded body may be needed for 3D-applications including e.g. package stacking.

FIGS. 1A to 4E exemplify stages of fabrication of a molded body 110 embedding semiconductor chips 104. In a first step (FIG. 1A), a carrier 101 is provided. The carrier 101 may be rigid or may be flexible to a certain degree and may be fabricated from materials such as metals, metal alloys, ceramic or plastics. The carrier 101 may be electrically conductive or insulating. An adhesive tape 102 may be laminated on the carrier 101. The adhesive tape 102 may be a double sided adhesive tape. Alternatively, a glue material or any other adhesive material or mechanical securing means (such as a clamping device or a vacuum generator) may be associated with the carrier 101.

Figure 1A:
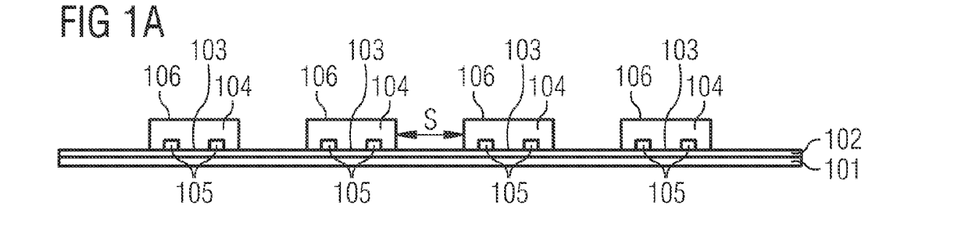
FIGS. 1A to 1E schematically illustrate steps of a method to fabricate a semiconductor device according to one exemplary embodiment.

Semiconductor chips 104 are placed on the carrier 101 and fixed by means of the adhesive tape 102 or other appropriate means. The semiconductor chips 104 are positioned to form an aligned array of semiconductor chips 104. The positions of the semiconductor chips 104 on the carrier 101 should correspond as precisely as possible to intended or nominal positions which are to be assumed in further processing steps as will be described later. By way of example, further processing steps may include structuring processes which may rely on the dimensional accuracy of the semiconductor chip 104 placement. Such structuring processes may use masks which have to be designed in advance in accordance with the nominal semiconductor chip 104 positions. The deviation between the actual semiconductor chip positions after placement and the nominal (i.e. expected, e.g. mask-implemented) chip positions should be less than about a few micrometers (e.g. less than about 15 or 10 µm) in order to guarantee proper alignment between the semiconductor chips 104 and any structure to be applied to the molded body 110 during subsequent processing. Such degree of accuracy can be achieved by conventional pick-and-place equipment or by self alignment techniques using self alignment patterns on the carrier 101. The distance S between neighboring semiconductor chips 104 may e.g. be in the range between 0.25 mm and 10 mm. The array of semiconductor chips 104 may be regular, i.e. the distance S between any two neighboring semiconductor chips 104 may be constant within the placement tolerances.

Semiconductor chips 104 may have contact pads 105 on a first main chip surface 103 facing the carrier 101. If the semiconductor chips 104 are power transistors, the contact pads 105 may be a source terminal and a gate terminal. In other cases, e.g. if the semiconductor chip 104 is a power diode, only one contact pad (e.g. the anode terminal) may be provided on the first main chip surface 103. If the semiconductor chip 104 is a logic integrated circuit such as e.g. a microprocessor, a microcontroller, a DSP (digital signal processor) or a memory circuit such as e.g. a DRAM, SRAM, ROM, PROM, EPROM, EEPROM etc., typically tens to hundreds of contact pads 105 are arranged on the first main chip surface 103. It is to be noted that the first main chip surface 103 typically forms the active surface of the semiconductor chip 104.

Figure 1B:
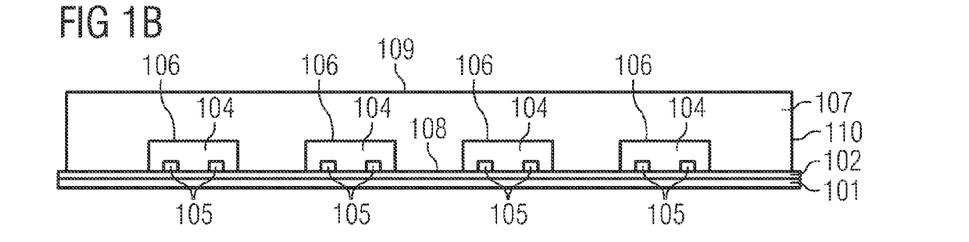

As shown in FIG. 1B, an electrically insulating encapsulation or molding material 107 may be applied to the semiconductor chips 104 and the carrier 101. The molding material 107 may be used to encapsulate the semiconductor chips 104 except their bottom first main chip surface 103 containing the contact pads 105. In particular, the side faces and a top second main chip surface 106 opposite to the first main chip surface 103 may be completely covered by the molding material 107. The molding material 107 may be an epoxy or another appropriate material used in contemporary semiconductor packaging technology. It may also be a photoresist such as SU8, which is epoxy-based. The molding material 107 may be composed of any appropriate thermoplastic or thermosetting material and may contain organic or anorganic filler materials. After curing, the molding material 107 provides stability to the array of semiconductor chips 104. Various techniques may be employed to cover the semiconductor chips 104 with the molding material 107, for example compression molding or injection molding.

By way of example, in a compression molding process the liquid molding material 107 is dispensed into an open lower mold half of which the carrier 101 with the adhesive layer 102 forms the bottom. Then, after dispensing the liquid molding material 107, an upper mold half is moved down and spreads out the liquid molding material 107 until a cavity between the carrier 101 forming the bottom of the lower mold half and the upper mold half is completely filled. This process may be accompanied by the application of heat and pressure. After curing, the molding material 107 is rigid and forms the molded body 110. The contact pads 105 may remain exposed during the molding process. The first main chip surfaces 103 of the chips 104 may lie flush with the first (bottom) surface 108 of the molded body 110. The second (upper) surface 109 of the molded body 110 may completely cover the semiconductor chips 104, i.e. the semiconductor chips 104 may be completely over-molded. Typically, both main surfaces 108, 109 of the molded body 110 are coplanar to one another and define a x-y plane.

It is to be noted that throughout FIGS. 1A to 1E, only a partial section of the carrier 101 and/or the molded body 110 is illustrated, that is to say in practice, typically much more than four semiconductor chips 104 are placed on the carrier 101. The larger the lateral size of the molded body 110 ("molded reconfigured wafer") and the number of embedded semiconductor chips 104, the more cost efficient the process will typically be.

Figure 1C:
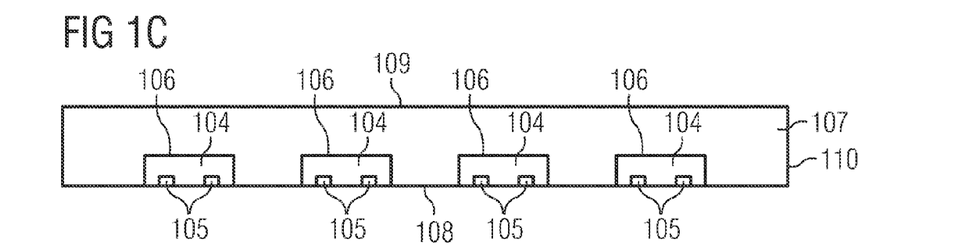

In FIG. 1C, the molded body 110 is released from the carrier 101. To this end, the adhesive tape 102 may feature thermo-release properties, which allow the removal of the adhesive tape 102 during a heat treatment. The removal of the adhesive tape 102 from the molded body 110 including the semiconductor chips 104 is carried out at an appropriate temperature which depends on the thermo-release properties of the adhesive tape 102 and is usually higher than 150° C., in particular approximately 200° C.

Figure 1D:
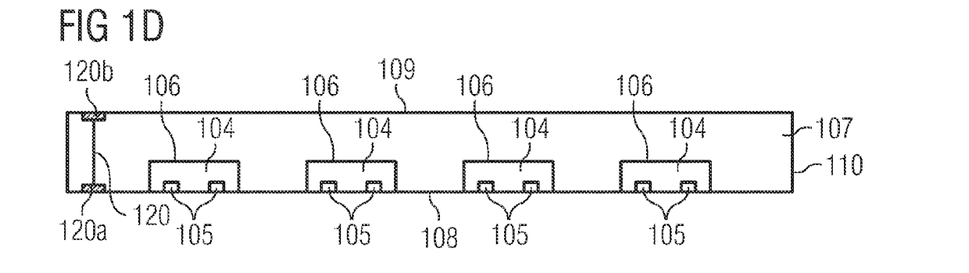

FIG. 1D illustrates in a schematic fashion the application of a marking element 120 to the molded body 110. The marking element 120 is detectable from a "looking-up" direction facing the first main surface 108 of the molded body 110 at an area 120a, and is detectable from a "looking-down" direction facing the second main surface 109 of the molded body 110 at an area 120b. The marking element 120 is positioned to be located in a known (e.g. predetermined) positional relationship to the array of aligned semiconductor chips 104. In other words, the nominal positions of the semiconductor chips 104 in one dimension of the x-y plane can be derived from the position of the marking element 120 with high accuracy, say less then e.g. 10 or 5 or 2 µm or even with sub-micron accuracy.

Figure 6:
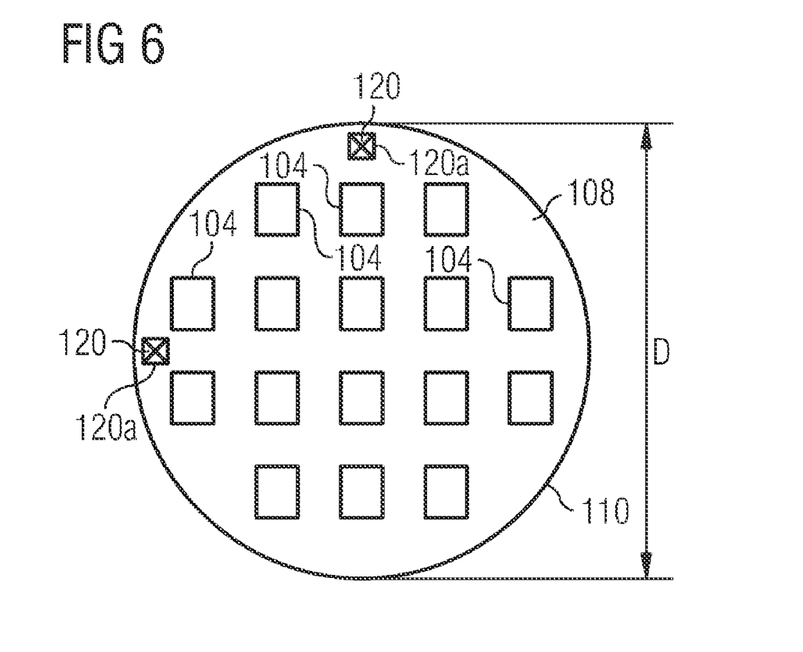
FIG. 6 is a schematic plan view of one exemplary implementation of a reconfigured wafer.

It is to be noted that typically, a plurality of marking elements 120 is applied to the molded body 110. FIG. 6 illustrates a plan view on the first main surface 108 of the molded body 110. Here, by way of example, two marking elements 120 are visible at areas 120a and are positioned under an angle of 90° with respect to the center of the molded body 110. Naturally, also more than two marking elements 120 may be used. The marking elements 120 are also detectable from the second main surface 109 of the molded body 110.

In one embodiment, the marking elements 120 are applied to the molded body 110 by embedding them in the molded body 110. To this end, the marking elements 120 may be placed and positioned on the carrier 101 and encapsulated by the molding material 107 during encapsulation of the semiconductor chips 104. In another embodiment, the marking elements 120 are applied to the molded body 110 after encapsulation of the semiconductor chips 104 and curing or hardening of the molding material 107. In this case, by way of example, the marking elements 120 could be generated by e.g. laser drilling through-holes in the molded body 110 or by generating embossing marks in the first and second main surfaces 108, 109 of the molded body 110 at the areas 120a and 120b, respectively. If the marking elements 120 are applied after the manufacture of the molded body 110, the proper positioning of the marking elements 120 may be assisted by optical pattern recognition systems which may be used to observe and interpret the pattern of semiconductor chips 104 visible at the first main surface 108 of the molded body 110.

Having applied marking elements 120 which are detectable from both surfaces 108, 109 to the molded body 110, the molded body 110 may be processed at both main surfaces 108, 109. In one embodiment, processing may comprise the deposition and structuring of conductive layers for establishing an electrical interconnect between external package terminals such as e.g. solder bumps or solder balls and internal contact elements such as e.g. the chip pads 105 or other conducting elements (not shown) provided in the molded body 110. For instance, as will be explained further below (see e.g. FIGS. 5A to 5D) in more detail, such conducting elements 400 may be generated within the molded body 110 to provide an internal wiring which, by way of example, could be used to route signals to the second main chip surfaces 106 or to the second main surface 109 of the molded body 110. Such conducting elements 400 oriented at least partly in z-direction may either be molded-in during the encapsulation step or may be manufactured in subsequent processing steps after curing or hardening of the molding material 107. Thus, in one embodiment, processing may comprise manufacturing steps such as etching or drilling the molded body 110 from one of the main surfaces 108, 109. Processing the first main surface 108 and the second main surface 109 is greatly facilitated because the marking elements 120 are detectable on both main surfaces 108, 109 of the molded body 110. In other words, the marking elements 120 define a single, global coordinate system or coordinate plane which is observable and thus available from both main surfaces 108, 109 of the molded body 110. As a result, by way of example, a single-sided reconfigured wafer processing equipment could be used, in which, after processing the molded body 110 from one side, the molded body 110 is flipped and processed from the other side.

Figure 1E:
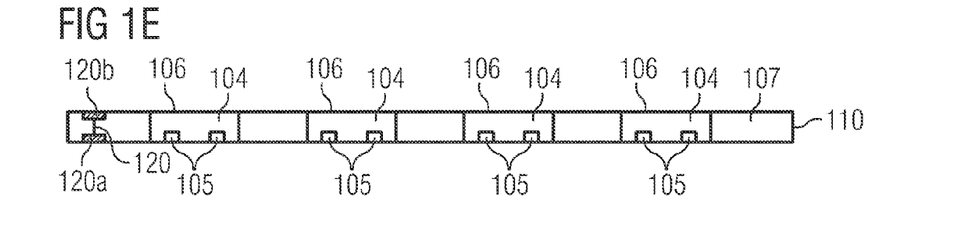

In a subsequent processing step shown in FIG. 1E, the molded body 110 may optionally be thinned. Grinding or lapping machines may be used that are similar or identical to the machines used for semiconductor wafer grinding or lapping in frontend technology. Whilst grinding tools use an abrasive wheel, lapping tools use a fluid charged with a "rolling" abrasive particles acting between two surfaces. Alternatively, etching may be used to reduce the thickness of the molding material 107. Thinning of the molding material 107 may be continued until at least the second main surfaces 106 of the semiconductor chips 104 are exposed. It is also possible that the thinning may further be continued to also reduce the thickness of the semiconductor chips 104.

After thinning the molded body 110, the marking elements 120 should still be detectable at the (thinned) second main surface 109 of the molded body 110 at area 120*b*. Options how to produce such marking elements 120 which remain operative after thinning will be explained further below.

In one embodiment, the molded body 110 is molded as shown in FIG. 1E, i.e. having semiconductor chips 104 which are exposed at both main surfaces 108, 109 of the molded body 110 right after molding. Further, in one embodiment, the semiconductor chips 104 may have additionally or exclusively contact pads at the second main chip surface 106 and/or the second main chip surface 106 may be the active surface of the semiconductor chips 104.

By way of example, the molded body 110 may have a thickness of about a couple of hundred micrometers, e.g. more than 200 μm, 500 μm or even more than 1000 μm. The thickness of the molded body 110 in FIG. 1D is greater than the thickness of the semiconductor chips 104. As semiconductor wafers are often fabricated with a thickness of about 500 μm or 1000 μm (typically 730 μm for 200 mm wafers and 780 μm for 300 mm wafers), and may be ground in preassembly processes to be as thin as about 200 μm or even less, the thickness of the semiconductor chips 104 before thinning may e.g. be in a range between about 200 μm and 1000 μm.

FIGS. 2A to 2G schematically illustrate one embodiment of a method to fabricate a semiconductor device. According to FIGS. 2A and 2B, semiconductor chips 104 are placed in an aligned positional relationship to one another on the carrier 101 coated with an adhesive tape 102, and are over-molded. To avoid reiteration, reference is made to the description in conjunction with FIGS. 1A and 1B.

Figure 2A:
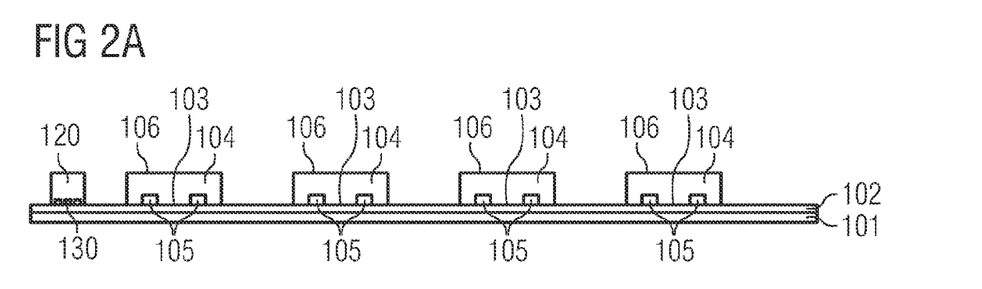
FIGS. 2A to 2G schematically illustrate steps of a method to fabricate a semiconductor device according to one exemplary embodiment.
Figure 2B:
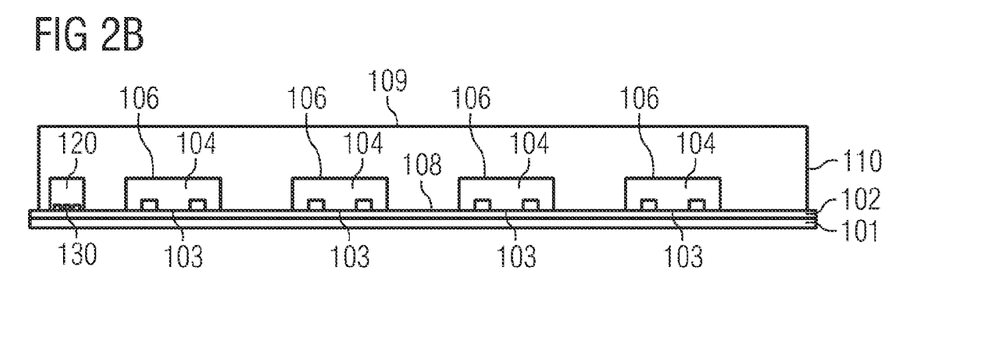

In one embodiment, by way of example, the marking element 120 is made of a chip which is transparent to light, preferably in a wavelength spectrum visible to the human eye. For instance, the marking element 120 may be made of glass, quartz crystal or silicon, with silicon being transparent to IR (infrared) light. The marking element 120 may have about the same or a greater height as the semiconductor chips 104. The lateral dimensions of the marking element 120 in x and y directions may also be in the same range as the lateral dimensions of the semiconductor chips 104, e.g. may be a few millimeters. As already explained above, the position of the marking element 120 on the carrier 101 and in the molded body 110 is exactly defined in relation to the nominal positions of the array of semiconductor chips 104.

The surface of the marking element 120 which faces the carrier 101 may be provided with a line pattern 130. The line pattern 130 may comprise geometric elements such as e.g. concentric circles, rhombuses and/or a cross line pattern. By way of example, the cross line pattern may define a specific point in the x-y plane which serves as a reference point established by the marking element 120, and the other geometric elements or patterns may be configured to facilitate the location and detection of the cross line pattern. The geometric elements are made of a material which is nontransparent to light.

Figure 2C:
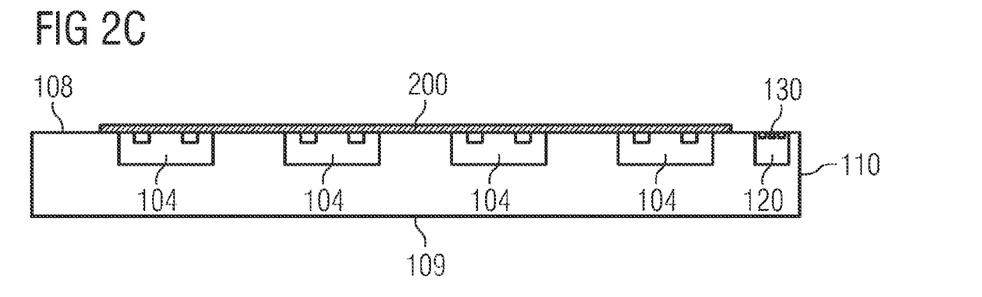
Figure 2D:
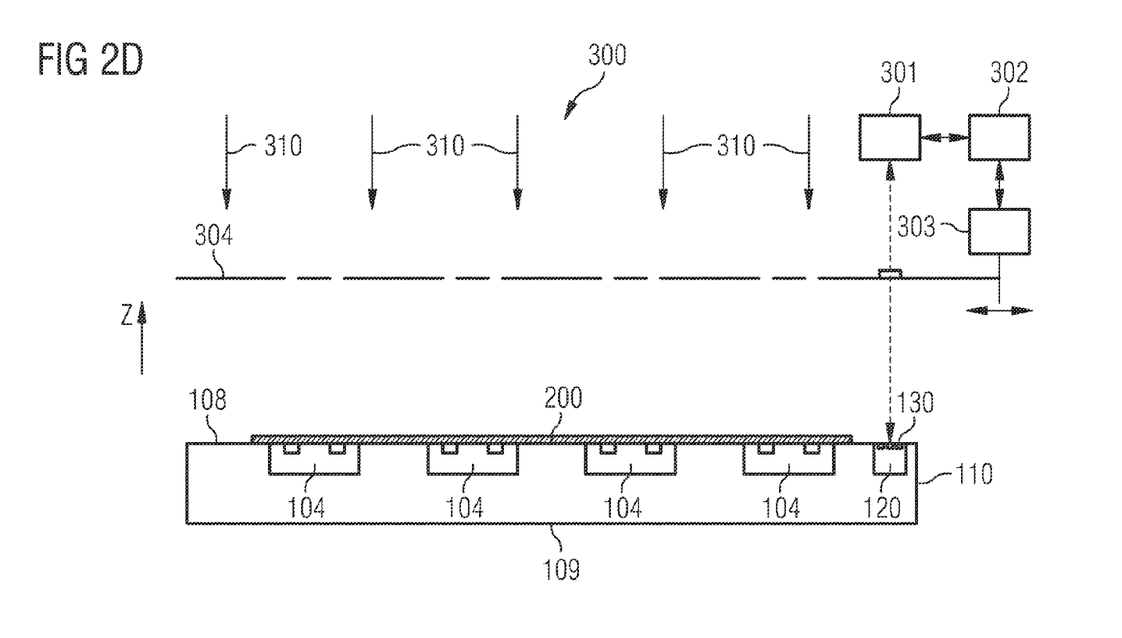

After releasing the molded body 110 from the carrier 101, the molded body 110 may be processed to generate a structure on the first main surface 108, see FIG. 2C. In one embodiment, an electrical redistribution structure may be generated. To this end, a dielectric polymer layer 200 may be deposited e.g. by chemical vapor deposition (CVD), physical vapor deposition (PVD) or spin coating on the first main surface 108. The dielectric polymer layer 200 may be made of a photoresist or of any other etching resist. The molded body 110 is then processed by photolithography using a specific equipment often referred to in the art as mask aligner. Briefly, as shown in FIG. 2D, the mask aligner 300 may comprise an optical detector or camera 301, a controller 302, a positioner 303 and an optical mask 304. The optical mask 304 may have a predetermined regular array of mask structures which corresponds to the regular array of semiconductor chips 104 in the molded body 110. By way of example, the dielectric polymer layer 200 shall be opened at the positions of the chip pads 105. To this end, the optical mask 304 has to be held in accurate positional alignment to the molded body 110. The detector or camera 301 detects the positions of the marking elements 120 in the x-y plane (e.g. by recognition of the line pattern 130) and may further detect the position of the optical mask 304 in the x-y plane. The controller 302 compares the detected positions and the positioner 303 controls the position of the optical mask 304 in the x-y plane by feedback operation to be as close as possible to the ideal alignment position. Alternatively, the position of the molded body 110 may be controlled whilst the position of the optical mask 304 remains fixed. In other words, the marking elements 120 are used as reference points associated with the position of the array of semiconductor chips 104 in the x-y plane to properly adjust the position of the optical mask 304 in the x-y plane. Submicron precision may be obtained. After alignment, the dielectric polymer layer 200 is exposed by light 310 passing through transparent regions in optical mask 304. Alternatively to a mask aligner which exposes the whole area of a wafer or molded body 110 in one shot, a specific equipment often referred to in the art as stepper can be used for the exposure process. Other than a mask aligner, a stepper exposes partial areas of the wafer (molded body 110) by a smaller optical mask (reticle) in multiple shots.

Figure 2E:
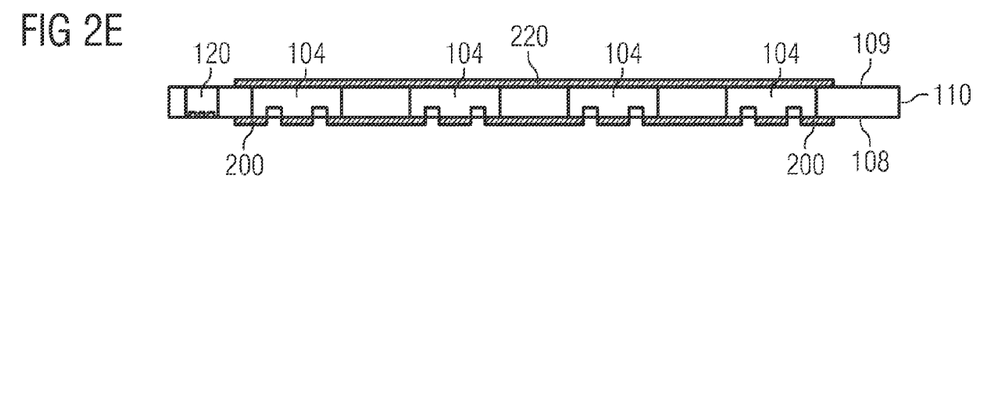

In one embodiment, as shown in FIG. 2E, the exposed regions of the dielectric polymer layer 200 may be removed by e.g. etching or developing. That way, the chip pads 105 are exposed. The molded body 110 may then be ground. As already mentioned, grinding may also be accomplished during an earlier stage of the processing and/or may be incomplete so as to leave the back main surfaces of the semiconductor chips 104 covered by mold material 107.

Figure 2F:
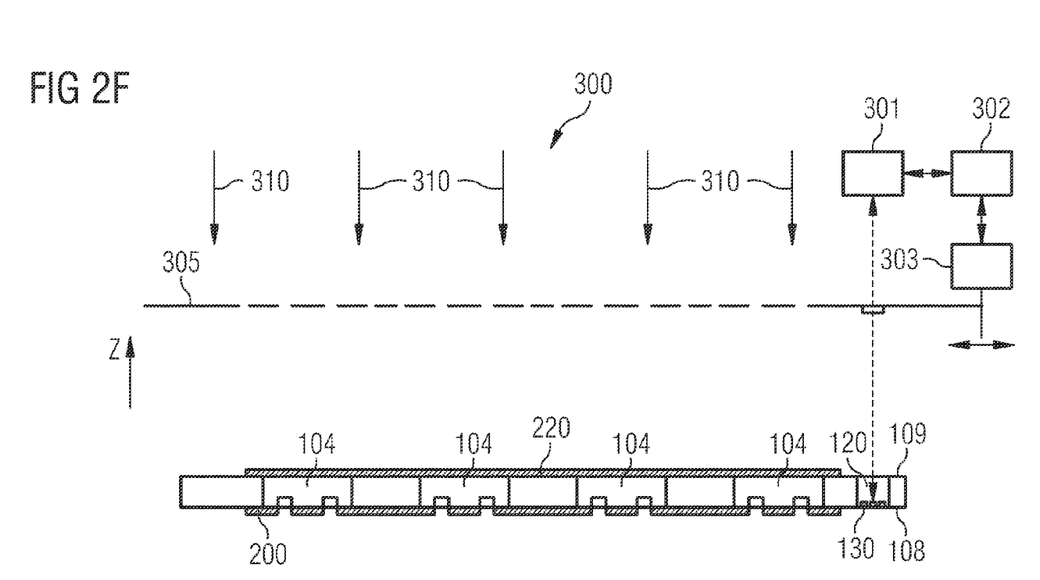

Then, as shown in FIG. 2E, the molded body 110 may be flipped and the second main surface 109 of the molded body 110 may be covered with another layer to be structured, e.g. another dielectric polymer layer 220. As shown in FIG. 2F, the molded body 110 may again be processed in the mask aligner 300. The same reference points defined by the marking elements 120 may be used to determine the position of the molded body 110 in order to provide for mask alignment. Typically, another optical mask 305 which is different to optical mask 304 may be used to process the second main surface 109 of the molded body 110. The predetermined transmission structure implemented in optical mask 305 may be configured to match to locations of conducting elements (not shown) integrated within the molded body 110 or to locations of chip pads (not shown) located at the second main surface 106 of the semiconductor chips 104.

It is to be noted that the optical detector or camera 301 may recognize one and the same structure in FIGS. 2D and 2F, namely the nontransparent line pattern 130 at the bottom side of the transparent marking element 120 (if the marking element 120 is made of silicon, an IR detector or camera 301 should be used). However, as explained above, different types of marking elements 120 such as e.g. holes, embossing recesses etc. could be used, resulting in that it is also possible that the optical detector or camera 301 detects different marks (e.g. line patterns, holes or embossing recesses) at both sides of the molded body 110 within the areas 120a and 120b, respectively. In that case, the marks at the first and second surfaces 108, 109 should be precisely aligned to one another with respect to the x-y plane, or should have a predetermined and known displacement to one another.

It is to be noted that the layers 200, 220 may generally be of any structurable material, i.e. are not confined to layers made of polymeric material. In one embodiment, the layers 200, 220 to be structured may be sacrificial layers or mask layers which are removed in later processing steps. Further, other structuring processes such as laser-writing, laser-evaporation, etc. taking advantage of the marking elements 120 for positional alignment may be used instead of photolithography based on optical masks 304, 305. Still further, machining processes such as drilling, cutting, stamping, milling etc. may be applied to layers 200, 220 or to one or both of the main surfaces 108, 109 of the molded body 110 and may take advantage of the marking elements 120 for positional alignment.

Figure 7:
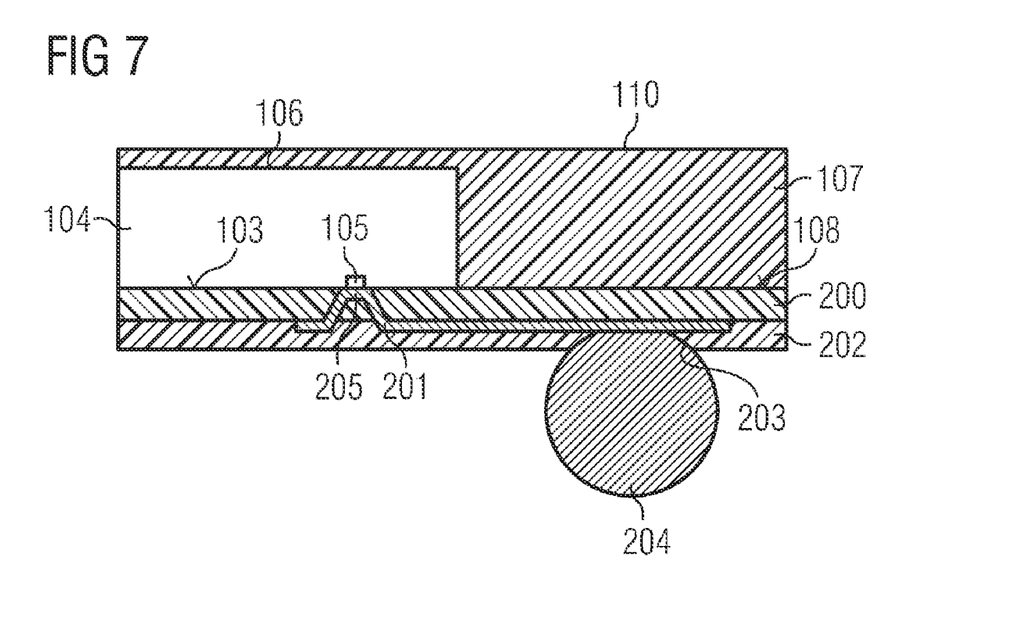
FIG. 7 is a schematic cross-sectional view of a structure applied to a first and/or second face of the reconfigured wafer according to one exemplary embodiment.

In one embodiment, a plurality of structured layers may be generated on each of the main surfaces 108, 109 of the molded body 110 by using the techniques described above. By way of example, FIG. 7 illustrates an electrical redistribution structure including a first polymer layer 200, a second polymer layer 202 and a metal layer 201 arranged between the first polymer layer 200 and the second polymer layer 202. The second polymer layer 202 comprises an opening 203 through which an electrical contact is made between an external contact element 204 (e.g. a solder ball or bump) and the metal layer 201. Thus, the second polymer layer 202 may act as a solder stop. The metal layer 201 may have a projecting portion 205 extending through an opening in the first polymer layer 200 to make electrical contact to chip pad 105.

Figure 2G:
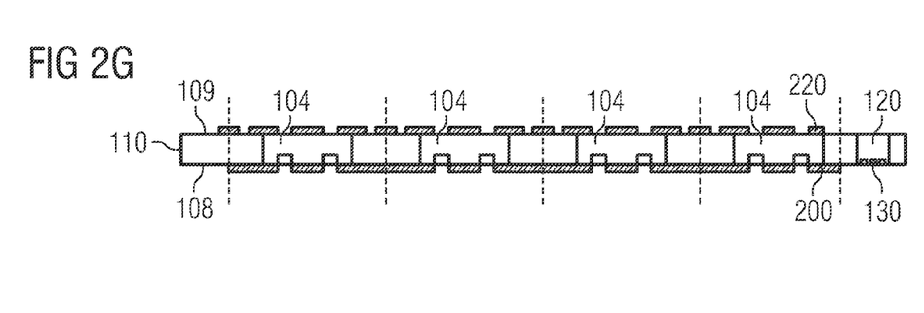

As shown in FIG. 2G, the molded body 110 may then be cut into single devices along the dashed lines. The single devices may be used in specific applications. By way of example, a plurality of such devices or packages may be vertically combined to establish package-on-package (PoP) configurations. When two or more packages are installed on top of one another, i.e. stacked, signals may be routed between them and board space may be saved. That way, the PoP technique allows to fabricate circuits having higher electronic and/or logic density at moderate cost.

Figure 3A:
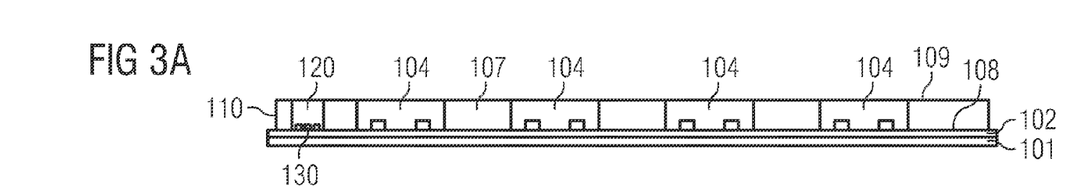
FIGS. 3A to 3C schematically illustrate a variant to method steps illustrated in FIGS. 2A to 2G.
Figure 3B:
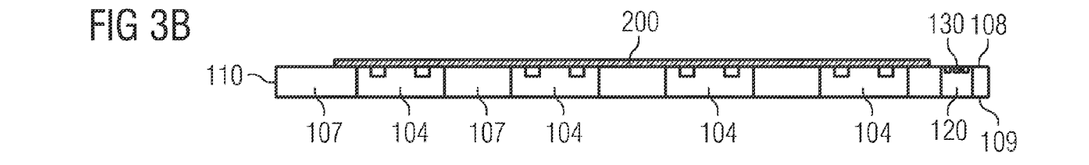
Figure 3C:
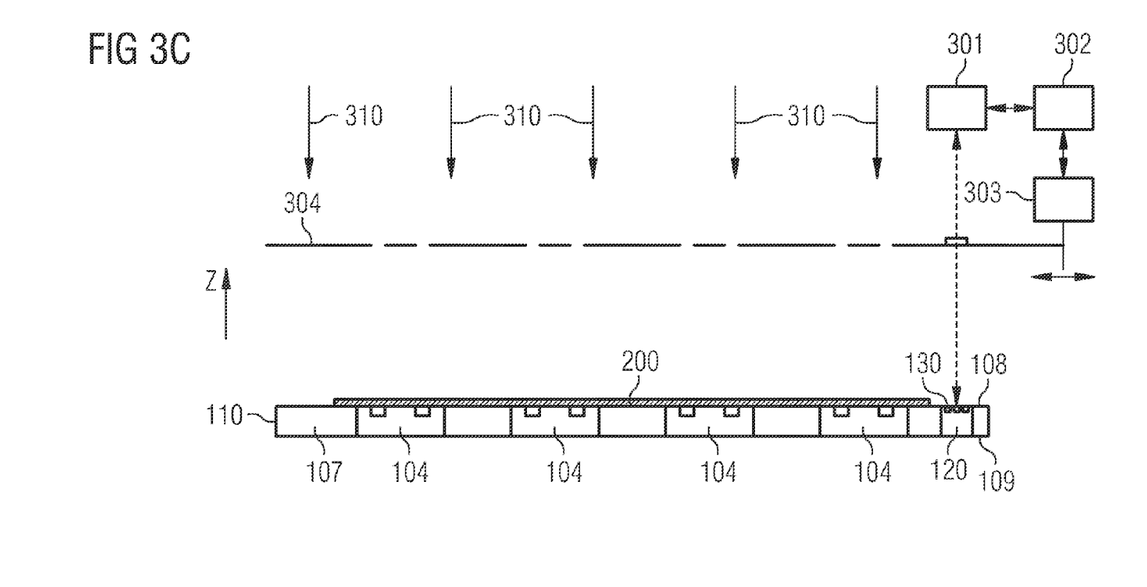

FIGS. 3A to 3C illustrate a variant to the embodiment of manufacturing a semiconductor device as shown in FIGS. 2A to 2G. FIG. 3A is similar to FIG. 1B and, in view of similarities, description is omitted to avoid reiteration. In contrast to the arrangement shown in FIG. 1B, the semiconductor chips 104 are exposed at the second main surface 109 of the molded body 110. As already mentioned, this could be achieved during molding or by grinding techniques applied to the arrangement shown in FIG. 2B. Thus, grinding may be performed prior to the structuring steps shown in FIGS. 2D and 2E. FIG. 3B illustrates the deposition of layer 200 on the first main surface 108 of the molded body 110 and FIG. 3C illustrates the structuring of layer 200.

Figure 4A:
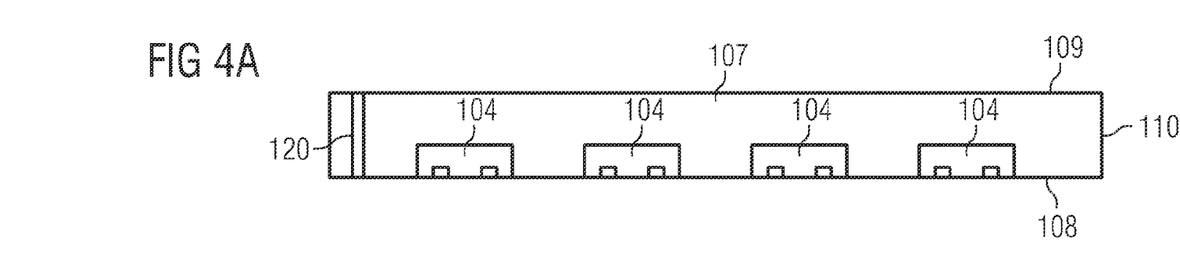
FIGS. 4A to 4B schematically illustrate a variant to method steps illustrated in FIGS. 2A to 2G.
Figure 4B:
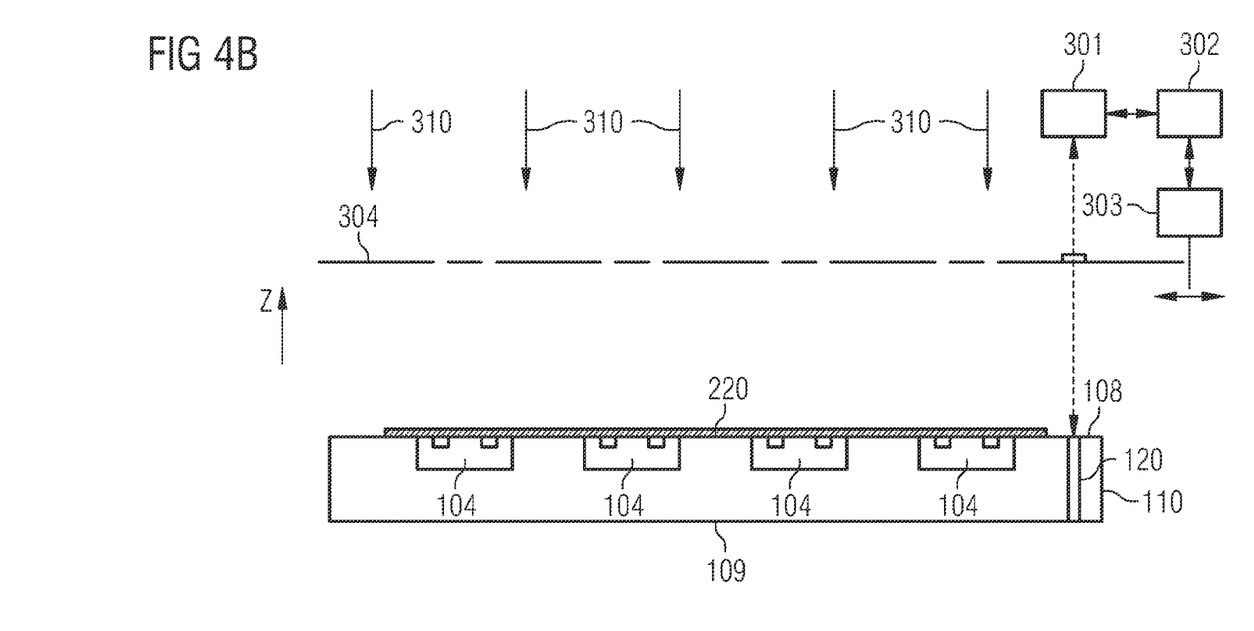

FIGS. 4A and 4B illustrate method steps which correspond to the method steps shown in FIGS. 2B and 2D, respectively, and reference is made to the description presented earlier herein. In FIG. 4A, the marking element 120 is established by a through-hole penetrating the molded body 110. Optical recognition of the position of the molded body 110 may be made by observing the through-hole 120 by the detector or camera 301. By way of example, the circular edge of the through-hole 120 at the first main surface 108 may be used by detector 301 for determining the position of the molded body 110 within the x-y plane. Naturally, when processed from the other side as illustrated in FIG. 2F, the edge of the through-hole 120 at the second main surface 109 of the molded body 110 may be used. Apparently, when using through-holes as marking elements 120, grinding is possible without destroying the operability of the marking elements 120.

FIGS. 5A to 5D illustrate processing steps according to one further embodiment. Here, conducting elements hereinafter referred to as conductors 400 are embedded within the molded body 110. The conductors 400 represent an internal wiring within the molded body 110 and are arranged to route electrical signals from the first main surface 108 of the molded body 110 in z-direction to the second main surface 109 of the molded body 110.

Figure 5A:
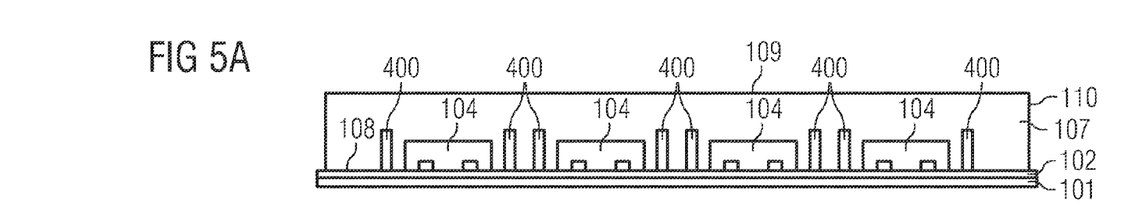
FIGS. 5A to 5E schematically illustrate steps of a method to fabricate a semiconductor device according to one exemplary embodiment.
Figure 5B:
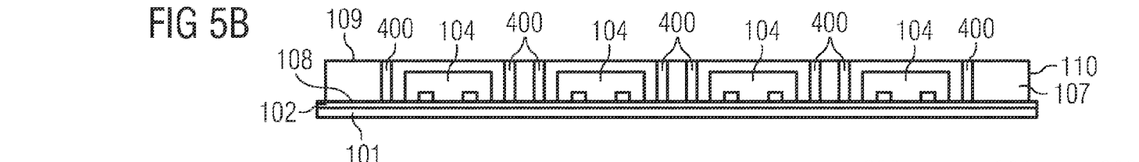

As shown in FIG. 5B, the conductors 400 are exposed at the second main surface 109 of the molded body 110 by e.g. grinding. In one embodiment (not shown), the conductors 400 may be exposed by etching the molded body 110 at the positions in the x-y plane at which the conductors 400 are provided. Such etching, by way of example, could also be accomplished by structuring techniques using the marking elements 120 for proper alignment as described above.

Figure 5C:
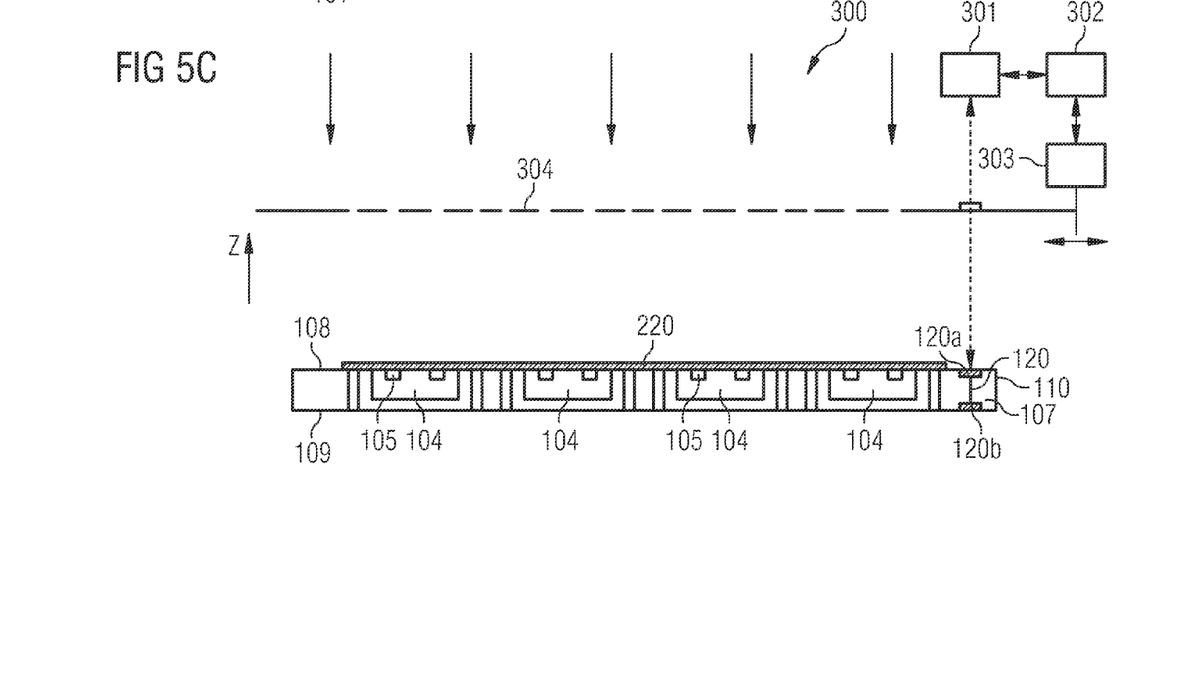

Later, the first main surface 108 of the molded body 110 is covered with a polymer layer 200, and the polymer layer 200 is exposed in a mask aligner 300 and structured as described earlier. Then, another structured layer 210 made of a conducting material such as e.g. metal may be formed on the structured polymer layer 200 to connect the chip pads 105 to the conductors 400. It is to be noted that only a part of the chip pads 105 may be connected to conductors 400, whereas another part of the chip pads 105 may be connected to an electrical redistribution structure similar to the one shown in FIG. 7.

Figure 5D:
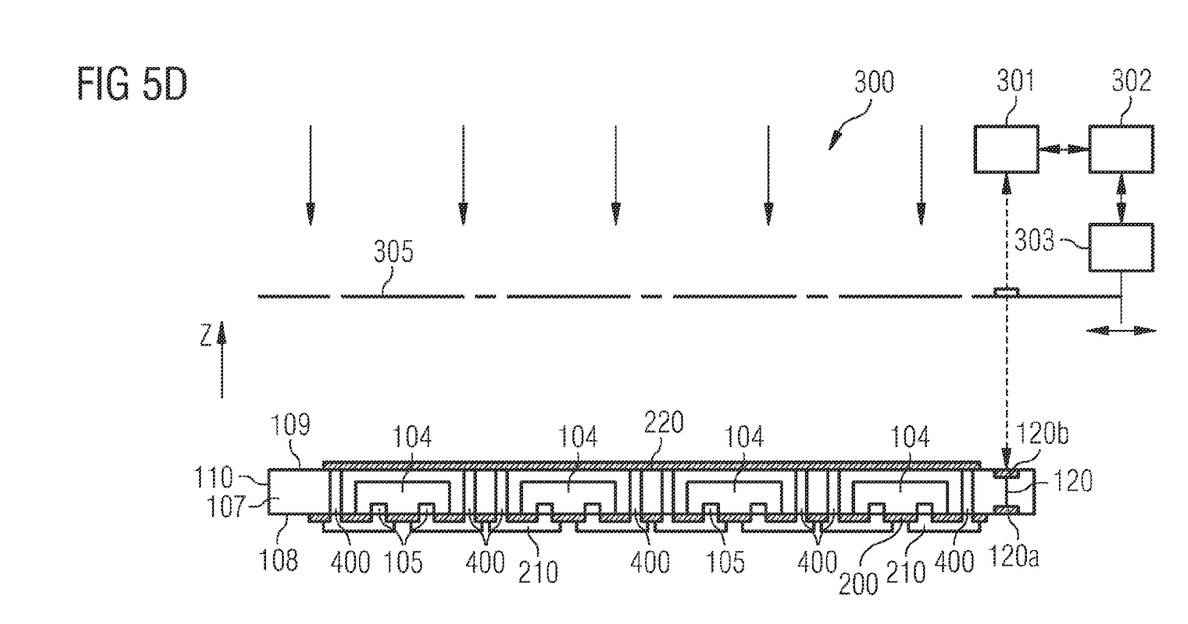
Figure 5E:
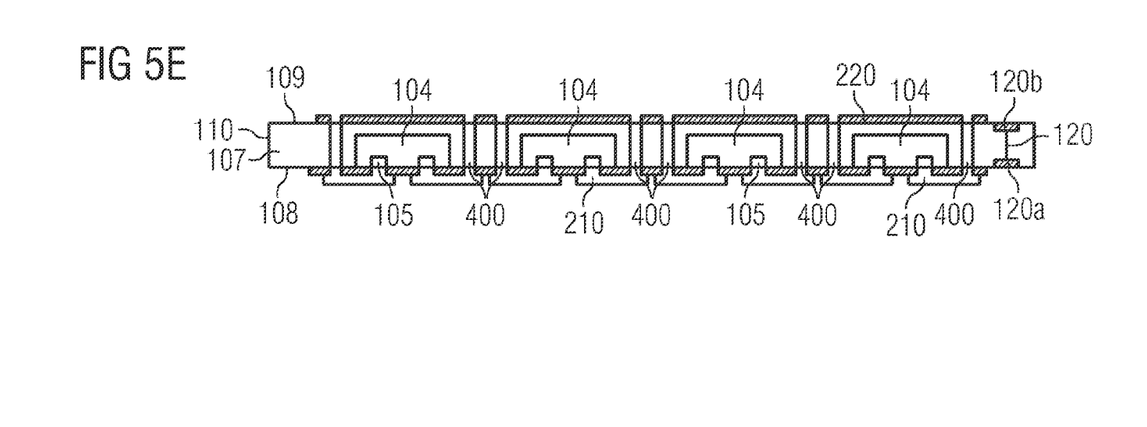

After structuring the layers 200, 210 and possibly further layers of an electrical redistribution structure to be formed on the first main surface 108 of the molded body 110, the molded body 110 is flipped and another layer such as e.g. polymer layer 220 is applied to the second main surface 109 of the molded body 110. As shown in FIG. 5D, the polymer layer 220 may then be exposed and subsequently structured as already explained.

Again, both sides of the molded body 110 may be processed with e.g. one single-sided mask aligner 300, which sequentially aligns masks 304, 305 used for processing both sides of the molded body 110 with reference to a single coordinate system which is detectable by virtue of the alignment elements 120 showing up in areas 120a and 120b at both main surfaces 108 and 109 of the molded body 110. On the other hand, in this and in the other embodiments, it is also possible to use a double-sided mask aligner 300 in which both main surfaces 108 and 109 of the molded body 110 may be exposed simultaneously from both sides in relation to the z-direction.

In one embodiment, the conductors 400 may be generated in an after-molding process by forming holes in the cured molded material 107 and filling these holes with liquid metal by using e.g. a molten metal vacuum suction technique. These holes may also be formed by alignment techniques assisted by the marking elements 120 as indicated above.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. This application is intended to cover any adaptations or variations of the specific embodiments discussed herein, and the invention is intended to be limited only by the claims and the equivalence thereof.

What is claimed is:

1. A method of manufacturing a semiconductor device, comprising:
   placing multiple chips onto a carrier;
   applying encapsulation material to the multiple chips and the carrier for forming an encapsulation workpiece, the encapsulation workpiece having a first main face facing the carrier and a second main face opposite to the first main face;
   applying marking elements to the encapsulation workpiece relative to the multiple chips, the marking elements being each detectable on the first main face and on the second main face; and
   detecting the marking elements by an optical recognition system facing the first main face.

2. The method of claim 1, wherein the marking elements are applied by placing a marking elements onto the carrier prior to application of the encapsulation material.

3. The method of claim 1, further comprising:
   aligning the marking elements relative to the multiple chips with a precision smaller than 10 μm.

4. The method of claim 1, wherein the marking elements are of a material different from the encapsulation material.

5. The method of claim 1, wherein the marking elements are made of a material from one or more of the group of glass, quartz crystal, or silicon.

6. The method of claim 1, further comprising:
   removing the carrier from the encapsulation workpiece.

7. The method of claim 1, wherein the marking elements are applied by forming the marking elements after the application of the encapsulation material to the multiple chips and the carrier.

8. The method of claim 1, wherein the marking elements are applied by forming through-holes through the encapsulation workpiece.

9. The method of claim 1, further comprising:
   applying a first structure to the first main face relative to the marking elements.

10. The method of claim 1, further comprising:
    applying a second structure to the second main face relative to the marking elements.

11. The method of claim 9, wherein the first structure comprises one or more of a metallization layer, an insulation layer, a masking layer and solder depots.

12. The method of claim 10, wherein the second structure comprises one or more of a metallization layer, an insulation layer, a masking layer and solder depots.

13. The method of claim 1, wherein the multiple chips have each contact elements on respective first main faces of the multiple chips and wherein the multiple chips are placed onto the carrier with the contact elements facing the carrier.

14. The method of claim 1, wherein the marking elements are applied relative to the contact elements of the multiple chips.

15. The method of claim 1, further comprising:
    cutting through the encapsulation material for obtaining multiple semiconductor devices.

16. The method of claim 1, further comprising:
    forming conducting vias extending from the first main face to the second main face.

17. The method of claim 1, further comprising:
    placing vertical conductors onto the carrier before applying the encapsulation material to the multiple chips and the carrier.

18. The method of claim 1, further comprising:
    grinding the second main face of the encapsulation workpiece to expose the marking elements.

19. The method of claim 1, further comprising:
    detecting the marking elements by the optical recognition system facing the second main face.

20. A method of manufacturing a semiconductor device, comprising:
    placing multiple chips onto a carrier;
    applying encapsulation material to the multiple chips and the carrier for forming an encapsulation workpiece, the encapsulation workpiece having a first main face facing the carrier and a second main face opposite to the first main face;
    applying marking elements to the encapsulation workpiece relative to the multiple chips, the marking elements being each detectable on the first main face and on the second main face;
    placing vertical conductors onto the carrier before applying the encapsulation material to the multiple chips and the carrier; and
    grinding the second main face of the encapsulation workpiece to expose the vertical conductors.

21. A method of manufacturing a semiconductor device, comprising:
    placing multiple chips onto a carrier;
    applying encapsulation material to the multiple chips and the carrier for forming an encapsulation workpiece, the encapsulation workpiece having a first main face facing the carrier and a second main face opposite to the first main face;
    applying marking elements to the encapsulation workpiece relative to the multiple chips, the marking elements being each detectable on the first main face and on the second main face; applying a first structure to the first main face relative to the marking elements;
    flipping the encapsulation workpiece; and
    applying a second structure to the second main face relative to the marking elements.

22. A method of manufacturing a semiconductor device, comprising:
    placing multiple chips onto a carrier;
    applying encapsulation material to the multiple chips and the carrier for forming an encapsulation workpiece, the encapsulation workpiece having a first main face facing the carrier and a second main face opposite to the first main face;
    applying marking elements to the encapsulation workpiece relative to the multiple chips, the marking elements being each detectable on the first main face and on the second main face;
    holding a first photomask over the first main face and aligning the first photomask relative to the marking elements; and
    holding a second photomask over the second main face and aligning the second photomask relative to the marking elements.

23. A method of manufacturing a semiconductor device, comprising:
    placing multiple chips onto a carrier;
    applying encapsulation material to the multiple chips and the carrier for forming an encapsulation workpiece, the encapsulation workpiece having a first main face facing the carrier and a second main face opposite to the first main face;

applying marking elements to the encapsulation workpiece relative to the multiple chips;

detecting marking elements by observing the first main face and processing the encapsulation workpiece at the first main face in positional alignment with the detected marking elements; and detecting marking elements by observing the second main face and processing the encapsulation workpiece at the second main face in positional alignment with the detected marking elements.

24. A method of manufacturing a semiconductor device, comprising:

placing multiple chips onto a carrier;

applying encapsulation material to the multiple chips and the carrier for forming an encapsulation workpiece, the encapsulation workpiece having a first main face facing the carrier and a second main face opposite to the first main face;

applying marking elements to the encapsulation workpiece relative to the multiple chips;

determining a first position of the encapsulation workpiece by detecting marking elements from a direction facing the first main face and processing the encapsulation workpiece in positional relationship with the determined first position; and determining a second position of the encapsulation workpiece by detecting marking elements from a direction facing the second main face and processing the encapsulation workpiece in positional relationship with the determined second position.

* * * * *